United States Patent
Kishi et al.

[11] Patent Number: 5,326,271
[45] Date of Patent: * Jul. 5, 1994

[54] IC SOCKET

[75] Inventors: Nobuaki Kishi; Norio Kobayashi; Junji Ishida, all of Saitama, Japan

[73] Assignee: Chichibu Fuji Co., Ltd., Saitama, Japan

[*] Notice: The portion of the term of this patent subsequent to Sep. 14, 2010 has been disclaimed.

[21] Appl. No.: 24,396

[22] Filed: Mar. 1, 1993

Related U.S. Application Data

[63] Continuation of Ser. No. 687,706, Apr. 19, 1991, Pat. No. 5,244,404.

[30] Foreign Application Priority Data

Oct. 31, 1990 [JP] Japan .................................. 2-296750

[51] Int. Cl.⁵ .................................................. H01R 9/09
[52] U.S. Cl. ..................................... 439/72; 439/331
[58] Field of Search ................... 439/70, 71, 72, 73, 439/330, 331, 525, 526, 372

[56] References Cited

U.S. PATENT DOCUMENTS

| | | | |
|---|---|---|---|
| 3,391,383 | 7/1968 | Antes | 439/331 |
| 4,560,216 | 12/1985 | Egawa | 439/72 X |
| 4,583,806 | 4/1986 | Tainter, Jr. et al. | 439/331 X |
| 4,758,176 | 7/1988 | Abe et al. | 439/72 X |
| 4,768,973 | 9/1988 | Bakermans | 439/331 |
| 4,940,432 | 7/1990 | Consoli et al. | 439/330 |
| 4,986,760 | 1/1991 | Petersen et al. | 439/72 X |
| 5,000,696 | 3/1991 | Matsuoka et al. | 439/331 |
| 5,009,608 | 4/1991 | Shipe | 439/73 X |

FOREIGN PATENT DOCUMENTS 2-25258 6/1990 Japan .

Primary Examiner—Khiem Nguyen
Attorney, Agent, or Firm—Sandler, Greenblum & Bernstein

[57] ABSTRACT

The invention relates to an IC socket, and more particularly an IC socket comprising a socket base plate having contacts on which the IC lead wires of the mounted IC are mounted and contacted, a pushing cover to be closed against the socket base plate through IC, and a pushing member for pressing the IC lead wires against the contacts in response to the closing operation of the pushing cover. Means for making a positive prevention of the displacements of the pushing positions of the IC lead wires by the pushing member is provided, that is, the pushing cover is rotatably supported on the socket base plate, the pushing member is supported on the socket base plate separate from the pushing cover and the pivoting shaft is supported in a longitudinal hole extending in a vertical direction and the pushing cover can be rotated and moved up and down vertically.

14 Claims, 7 Drawing Sheets

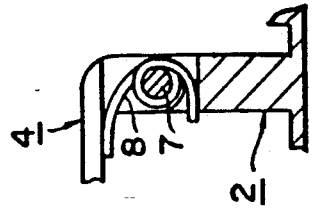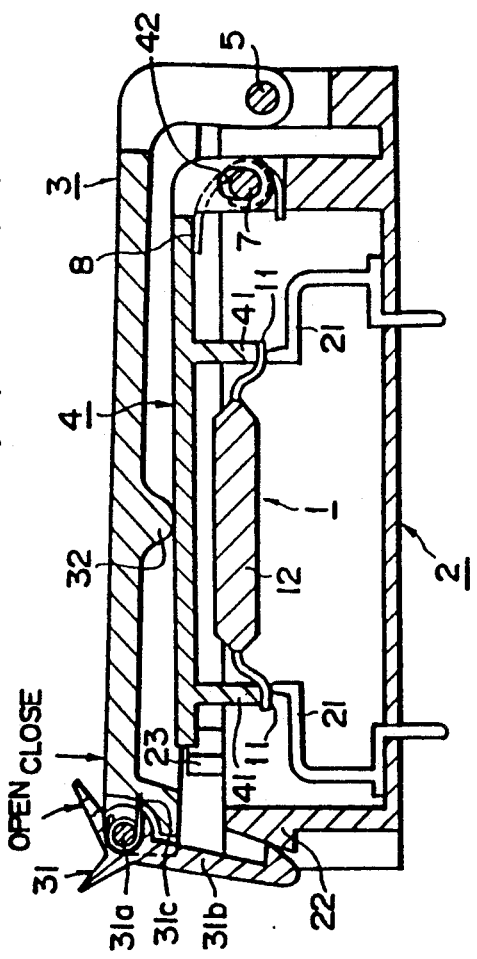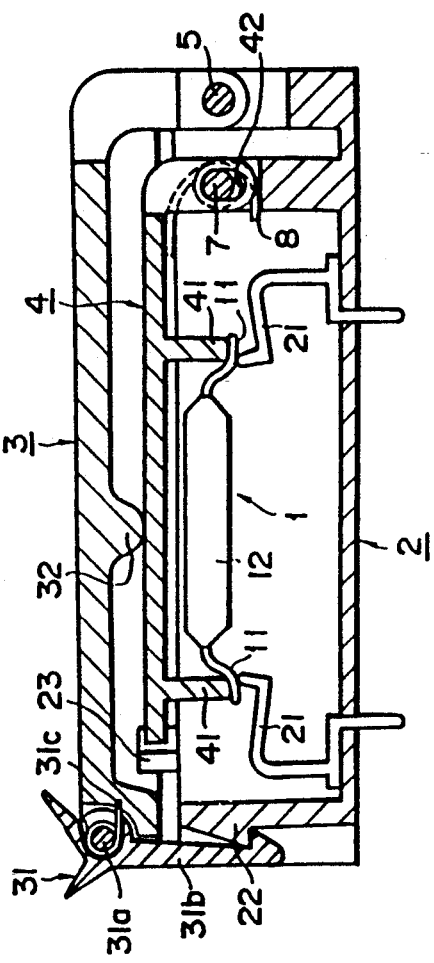

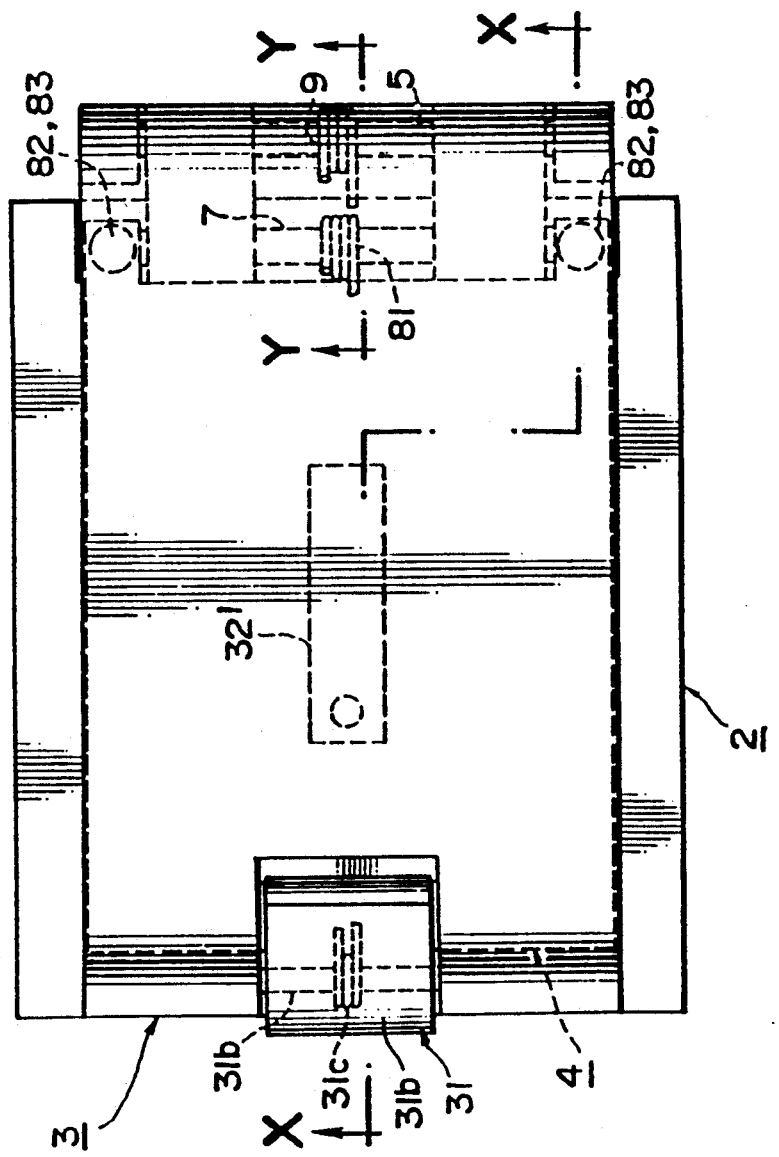

IC SOCKET

This application is a continuation of application Ser. No. 07/687,706, filed Apr. 19, 1991 now U.S. Pat. No. 5,244,404.

BACKGROUND OF THE INVENTION

1. Field of the Invention

This invention relates to an IC socket.

More particularly, the present invention relates to an improvement of a structure for contacting with the IC lead wires of an IC in an IC socket in which the IC is stored so as to perform an electrical conducting inspection or the like.

2. Description of the Prior Art

As a conventional IC socket, the socket described in Jap. Pat. Publn. No. Hei 2-25258 is already known.

As shown in FIG. 9, the conventional type of IC socket is comprised of a socket base plate 2 having resilient contacts 21 for mounting IC lead wires 11 of a mounted IC1, a pushing cover 3 rotatably supported at one end of the socket base plate 2 with a rotating shaft 5 and closed to the socket base plate 2 through the IC1, and a pushing member 4 rotatably supported at a substantial central part of the pushing cover 3 by a rotating shaft 6 for pushing the IC lead wires 11 against the contacts 21, integrally in cooperation with a closing operation of the pushing cover 3.

In the conventional type of IC socket described above, the pushing cover 3 which is rotated toward the socket base plate 2 to close it, is inclined toward the IC1 and approaches it. The pushing member 4 for pushing the IC lead wires 11 keeps its rotatable state in respect to the pushing cover 3 as well as its substantial horizontal state, and it can push the IC lead wires 11 uniformly, so that it is possible to prevent any imbalance of the pushing force against the IC lead wires 11 or prevent a displacing of the pushing locations or the like.

The aforesaid prior art IC socket has a problem, that the pushing positions of the IC lead wires 11 are displaced laterally in a horizontal direction by the pushing member 4, due to the fact that, as shown in FIG. 10, the pushing member 4 is supported by the pushing cover 3 and a moving locus of a supporting point (a rotating shaft 6) of the pushing member 4 in respect to the pushing cover 3, when the pushing cover 3 is moved toward the socket base plate in its closing operation, becomes an arcuate shape around a center of the supporting point (a rotating shaft 5) of the pushing cover 3 for the socket base plate 2.

SUMMARY OF THE INVENTION

The present invention can be summarized as follows: the aforesaid problems and it is an object of the present invention to provide an IC socket capable of positively preventing a displacement of the pushing positions of the IC lead wires caused by the pushing member.

An IC socket comprising a socket base plate having contact on which the IC lead wires of the mounted IC are mounted, is provided in which a pushing cover closed against the socket base plate with the IC being held therebetween a pushing member for pushing the IC lead wires against the contacts in response to a closing operation of the pushing cover is provided with means characterized in that the pushing cover is rotatably supported in the socket base plate, the pushing member is supported in the socket base plate separate from the pushing cover, a rotating shaft is supported in a longitudinal hole extending in a vertical direction, so that the pushing cover can be rotated and vertically moved.

The IC socket is further characterized in that a spring member for biasing the pushing member in a rotating opening direction and an upward direction of the vertical moving-up and down operation is arranged near a supporting part of the pushing member to the socket base plate.

Still further, the IC socket is characterized in that a spring member for biasing the pushing cover in a rotating opening direction is arranged near a supporting part of the pushing cover to the socket base plate, and another spring member for biasing the pushing member in a rotating opening direction and an upward direction of a vertical moving-up or down is arranged near a supporting part of the pushing member to the socket base plate.

The spring member for biasing the pushing cover in a rotating opening direction is arranged near a supporting part of the pushing cover to the socket base plate, another spring for biasing the pushing member in an upward direction of the vertical moving-up or -down is arranged near the supporting part of the pushing member to the socket base plate, and the pushing cover is provided with an engaging member for making an integration of the rotating opening operation of the pushing cover and the rotating opening operation of the pushing member.

The aforesaid means has the following actions: The pushing member is rotatably supported not to the pushing cover, but to the socket base plate separate from the pushing cover. The pushing member is supported at the socket base plate by a longitudinal hole and a rotating shaft structure in such a way as it may be moved up and down vertically, so that a movement of the supporting point of the pushing member rides in a vertical line when the pushing cover closes against the socket base plate, but does not show an arcuate shape as found in the prior art, and the pushing positions of the IC lead wires set by the pushing member are not displaced in a horizontal direction. Thus, an object of the present invention is to provide an IC socket capable of positively preventing displacements of the pushing positions of the IC lead wires caused by a pushing member.

The pushing member is biased under the aforesaid action in a rotating opening direction and an upward direction of the vertical moving-up or -down movement, so that after the pushing cover is closed against the socket base plate, upon releasing the closed state, the pushing member is automatically opened and an opening operation of the pushing cover is responsive to this opening operation and before closing the pushing cover against the socket base plate, a clearance is formed between the IC lead wires and the pushing member.

The pushing cover is biased by a spring in a rotating opening direction and the pushing member is biased in a rotating opening direction and an upward direction of a vertical moving-up or -down movement. Thus, after the pushing cover is closed against the socket base plate, a releasing of the closed state causes the pushing cover and the pushing member to be automatically and discretely opened, and before closing the pushing cover against the socket base plate, a clearance is formed between the IC lead wires and the pushing member.

The pushing cover is biased by a spring member in a rotating opening direction. The pushing member is biased in an upward direction of the vertical moving-up or -down direction. An engaging member for making an integral formation of the rotating opening operation of the pushing cover and the pushing member is arranged, so that after the pushing cover is closed against the socket base plate, the releasing of the closed state causes the pushing cover to be automatically opened and the opening operation of the pushing cover integrally responds to the opening operation. Before closing the pushing cover against the socket base plate, a clearance is formed between the IC lead wires and the pushing member.

The present invention has the following effects due to the aforesaid technical means and actions. Since the pushing member is kept at its horizontal state and moved downwardly against the IC lead wires vertically to press it, the pushing positions for the IC lead wires are not displaced and it has an effect that a positive pressing can be attained. Due to this effect, a positive electrical conduction can be attained for the IC lead wires and the contacts, and it has an effect capable of improving an accuracy in inspection such as an electrical conducting inspection or the like.

An external pressure or the like applied to the pushing cover under such a state as the pushing cover is closed can be accommodated by a frictional sliding between the pushing cover and the pushing member, and after closing of the pushing cover, the electrical conduction of the IC lead wires and the contacts may not be prohibited. Under such an effect as above, the present invention has an effect that a handling such as an electrical conducting inspection or the like is made easy.

In addition to the aforesaid advantages, it is possible to perform an opening operation of the pushing cover in respect to the opening operation of the pushing member, so that it has an effect that the mounting and taking-out of the ICs against the socket base plate can be efficiently carried out.

A clearance is formed between the IC lead wires and the pushing member, and the pushing member can be pushed uniformly against the IC lead wires under a horizontal state, so that it has an effect that the IC lead wires may not be damaged under a pressed condition of the pushing member.

BRIEF DESCRIPTION OF THE DRAWINGS

FIG. 2(A) is a central cross sectional view showing a closed state of the embodiment shown in FIG. 1.

FIG. 2(B) is a sectional view for showing a substantial part of FIG. 2(A).

FIG. 3 is a sectional view for showing a completely closed state of FIG. 2(A).

FIG. 4 is a top plan view of a second preferred embodiment in a closed state.

DESCRIPTION OF THE PREFERRED EMBODIMENTS

Referring now to FIGS. 1 to 8, the preferred embodiments of the IC socket of the present invention will be described.

Figure 1:
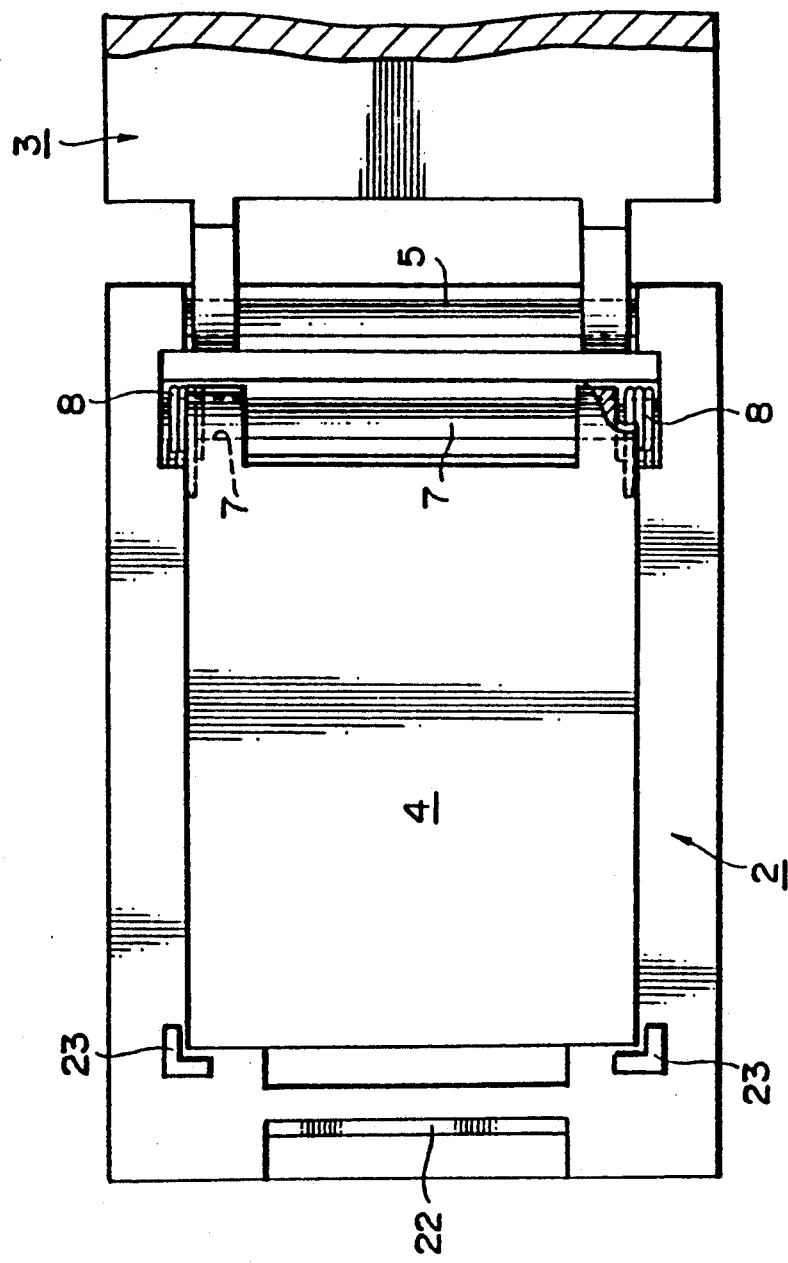
FIG. 1 is a top plan view for showing a partly opened state of the first preferred embodiment of the IC socket of the present invention.

FIGS. 1 to 3 illustrate the first preferred embodiment of the IC socket of the present invention.

In the preferred embodiment, although the socket base plate 2 and the pushing cover 3 have basically the same configuration as that of the prior art, the differences in respect to the prior art will be described in detail.

That is, the outer wall opposite to the supporting part of the socket base plate 2 for the pushing cover 3 is provided with an engaging part 22 of a slant projection shape to which the clamp 31 of the pushing cover 3 (to be described later) engages. In addition, the upper surface of the socket base plate 2 is provided with guides 23 having an L-shape as viewed from their top plan for preventing a displacement in a horizontal direction of the pushing member 4.

An end part of the pushing cover 3 opposite to the supporting part for the socket base plate 2 is provided with a clamp 31 for holding a closed state of the pushing cover 3 for the socket base plate 2. This clamp 31 is composed of a pivoting shaft 31 fixed to the end part, clamp claw 31b rotatably supported on the pivoting shaft and engageable with the engaging part 22 of the socket base plate 2, and a torsion spring 31c biasing the clamp claw 31b toward its engaging direction. In addition, a circular projecting raised part 32 is arranged at a substantial central part of an inner surface of the pushing cover 3.

In respect to the socket base plate 2 and the pushing cover 3, the pushing member 4 is rotatably supported by a pivoting shaft 7 separately from the pushing cover 3 at a location of the socket base plate 2 near the pushing cover 3. The pushing member 4 is formed into a flat plate and further forms a double-lid structure together with the pushing cover 3 in respect to the socket base plate 2. Its interior part has foot-type pressing portions 41 for pressing the IC lead wires 11, and the supporting end for the socket base plate 2 has a longitudinal hole 42 extending vertically to which the pivoting shaft 7 is fitted and supported. Accordingly, the pushing member 3 can move up and down in addition to its rotation. The pushing member 3 is biased in a rotating opening direction and an upward direction of the vertical moving-up or -down movement by a spring member 8 composed of a torsion spring fitted to the pivoting shaft 7 and resiliently pressed between the pushing member and the socket base plate 2.

With such a preferred embodiment as described above, the IC1 can be mounted on the socket base plate 2, the IC lead wires 11 can be mounted in the contacts 21 to contact with them, thereafter the pushing cover 3 is closed against the socket base plate 2, the pushing member 4 is pushed and moved while an outer surface of the pushing member 4 being frictionally slid with the raised projection 32 of the pushing cover 3 and then the IC lead wires 11 can be pressed by the pressing portions 41 of the pushing member 4. At this time, as shown in FIG. 2(A), when the pushing of the IC lead wires 11 with the pushing member 4 at the pressing portions 41 is started, the pushing member 4 abuts against the IC lead wires 11 while the pushing member 4 being held in a horizontal state. When the pushing cover 3 is pushed down, the pushing member 4 can be moved downwardly under a balanced state of a resilient force of the contacts 21 arranged in many rows and another resilient force of a spring member 8 while being held in a horizontal state (FIG. 3) and thus the IC lead wires 11 are uniformly pressed with the pushing portions 41 and no one-side pressing of the lead wires is attained. Accordingly, the pushing positions of the IC lead wires 11 at the pushing portions 41 are not displaced, the IC lead wires 11 are not damaged, and a positive electrical conduction of the IC lead wires 11 and the contacts 21 can be attained.

Such a closing described above can be kept under an operation of the clamp 31 (see FIG. 3) and the IC is applied to the electrical conduction inspection or the like while the member is closed. Even if an external pressure or a shock is applied by accident to the pushing cover 3, this external pressure or shock are absorbed by a frictional sliding between the raised projection 32 of the pushing cover 3 and an outer surface of the pushing member 4, resulting in that the pressing positions for the IC lead wires 11 may not be displaced by the pushing portions 41 during the electrical conducting inspection or the like.

The closing state is released by releasing the clamp 31. However, the spring member 8 biases the pushing member 4 in a rotating opening direction, so that the pushing member 4 is automatically opened in simultaneously with a releasing of the clamp 31 and the pushing cover 3 is also opened in such a manner as it is pushed up by the pushing member 4. Accordingly, a mounting and raking-up of the IC1 for the socket base plate 2 can be efficiently carried out.

In this preferred embodiment, a fixing side and a forming side of the engaging part 22 of the socket base plate 2 and the clamp 31 of the pushing cover 3 can be oppositely arranged.

Figure 5B:
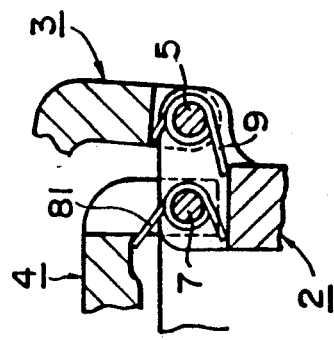
FIG. 5(B) is a sectional view taken along a line Y—Y of FIG. 4.
Figure 5A:
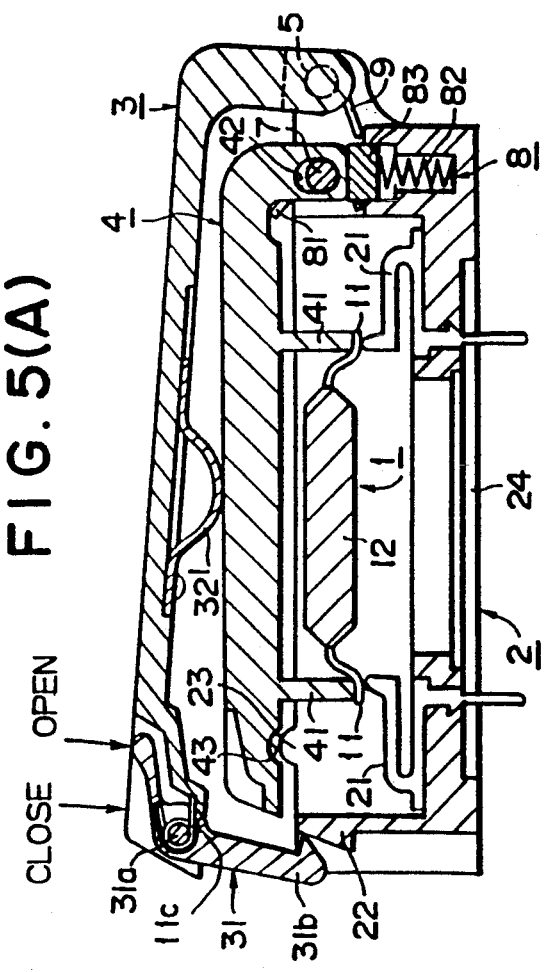
FIG. 5(A) is a sectional view taken along a line X—X of FIG. 4.
Figure 6:
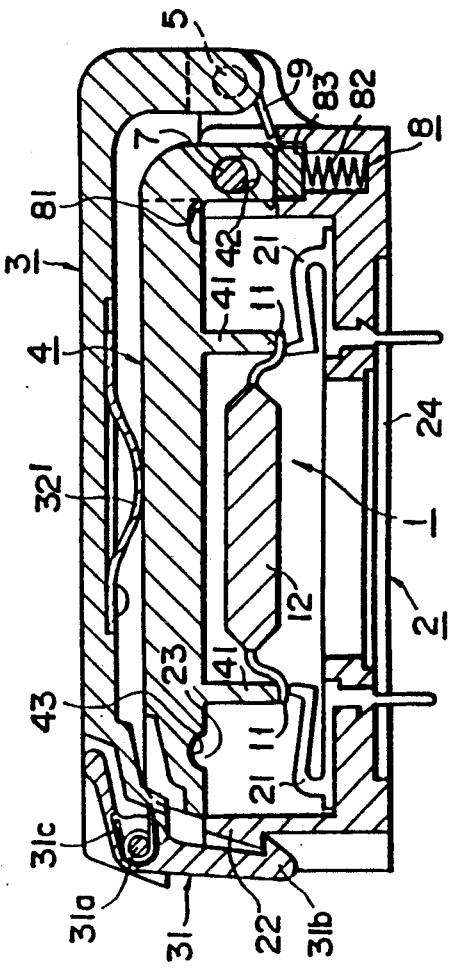
FIG. 6 is a sectional view for showing a complete closed state of FIG. 5(A).

FIGS. 4 to 6 illustrate the second preferred embodiment of the IC socket of the present invention, and this embodiment corresponds to one defined in claims 1 and 3.

In this preferred embodiment, a configuration of the first preferred embodiment described above is entirely applied basically. Differences between it and the first preferred embodiment will be described in detail.

That is, the guide part 23 arranged on the upper surface of the socket base plate 2 is made as a projection having a semi-circular cross section and a heat radiation hole 24 is opened at the lower surface of the socket base plate.

The pushing cover 3 is biased in a rotating opening direction with a spring member 9 composed of a torsion spring fitted to the pivoting shaft 5 and resiliently pressed between the pushing cover 3 and the socket base plate 2. In addition, the raised projection 32 arranged at the inner surface is made as a leaf spring type raised projection 32' bent into a semi-circular section.

The inner surface of the pushing member 4 is provided with a groove 43 engaged with the raised projection type guide part 23' of the socket base plate 2. The spring member 8 is composed of a torsion spring 81 biased toward a rotating opening direction, a coil spring 82 for biasing the pushing member 4 in an upward direction of the vertical moving-up or -down movement, and a seat plate 83 placed between the supporting end of the pushing member 4 and the coil spring 82. A rotating range of the pushing member 4 is restricted to 90° by a shape of the supporting end and the seat plate 83.

With the second embodiment described above, it basically the same action and effect are achieved as that of the first preferred embodiment it has some advantages that the mounting position of IC1 can be set accurately by the mounting guide 23 of the socket base plate 2. A cooperative moving relation of the pushing cover 3 and the pushing member 4 is made smooth by a resiliency of the leaf spring type raised projection 32' of the pushing cover 3, and two kinds of biasing operations of the pushing member 4 can be attained with the configuration of the other members of the spring member 8.

Since the pushing cover 3 is also provided with the spring member 9 for biasing it toward the rotating opening direction, the pushing cover 3 and the pushing member 4 can be automatically opened in a discrete manner and thus it is possible to make a different opening operation speed of the pushing cover 3 and the pushing member through adjustment of resilient forces of the spring members 8 and 9.

Figure 7:
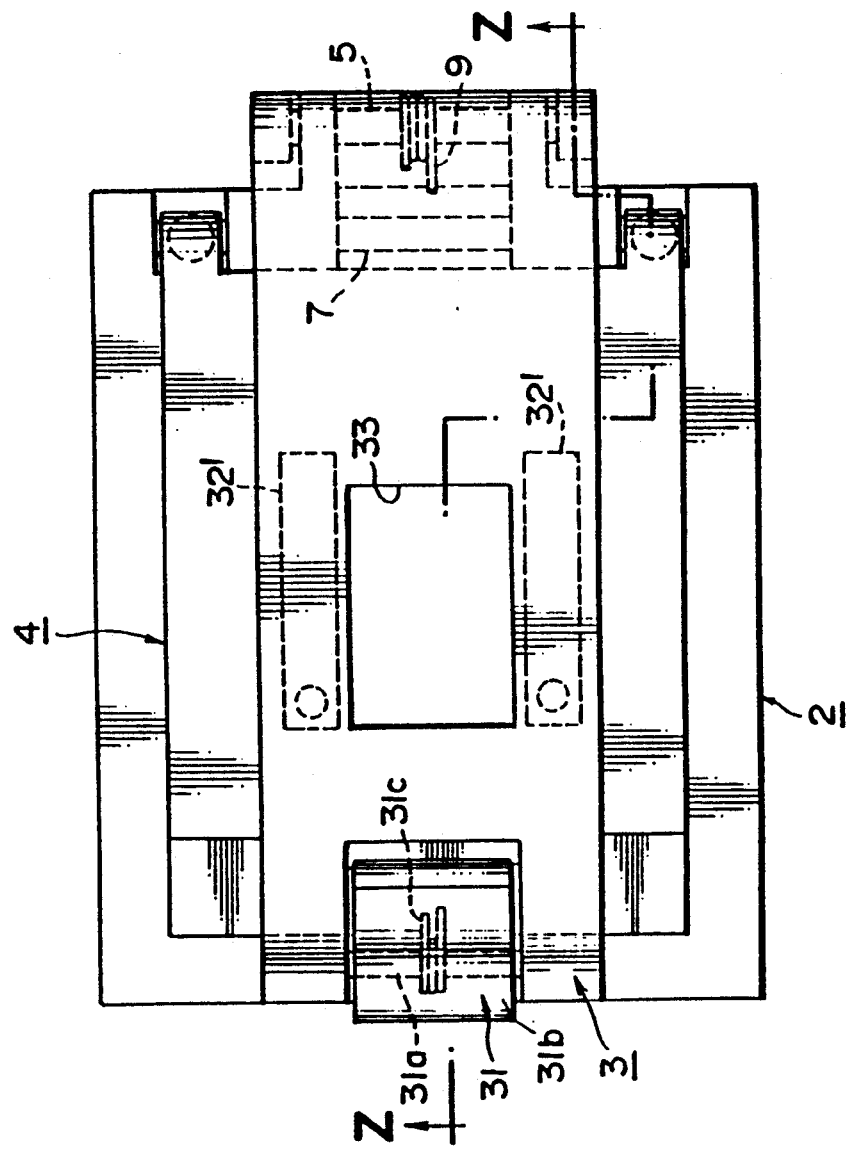
FIG. 7 is a top plan view for showing a state being closed to show the third preferred embodiment.
Figure 8:
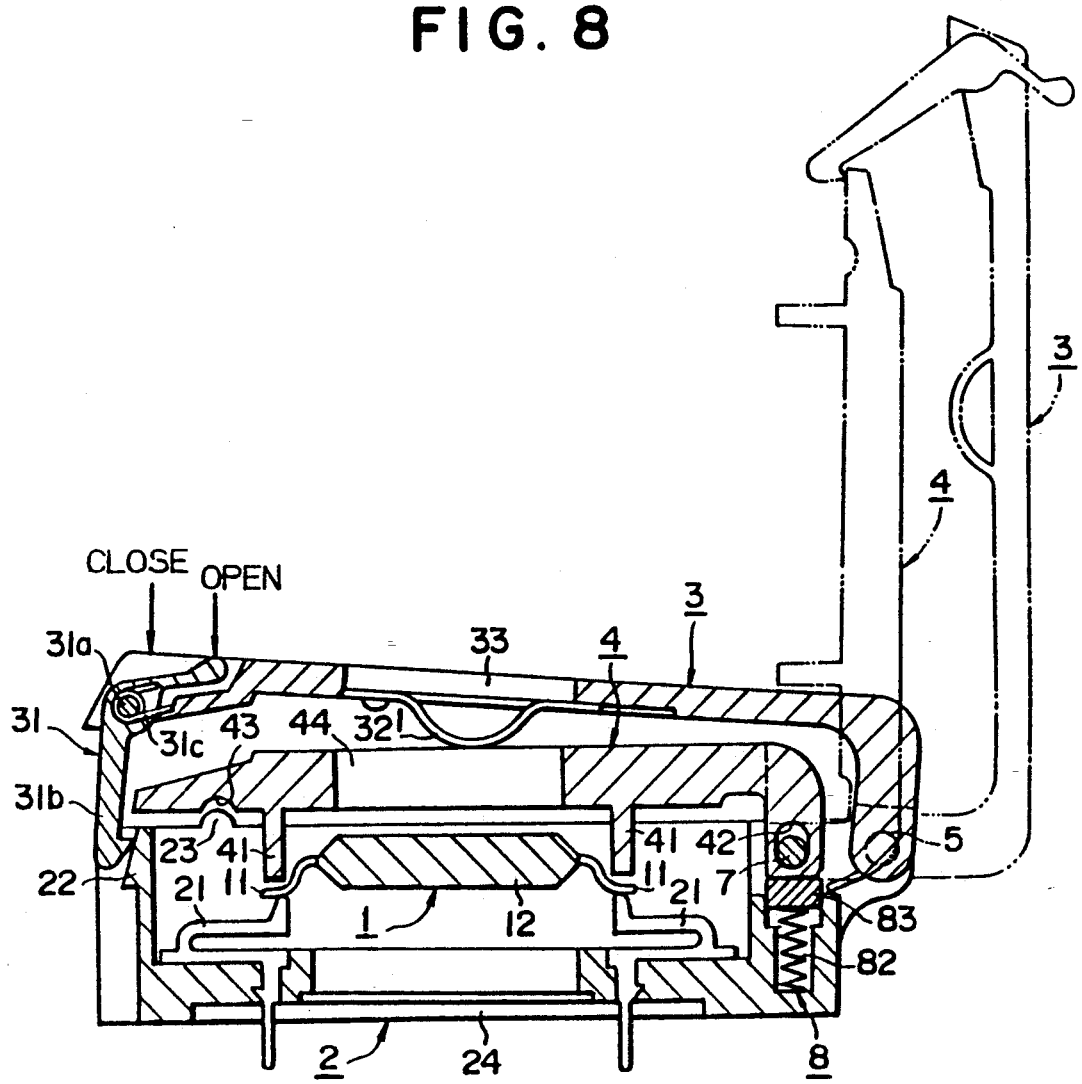
FIG. 8 is a sectional view taken along a line Z—Z of FIG. 7.
Figure 9:
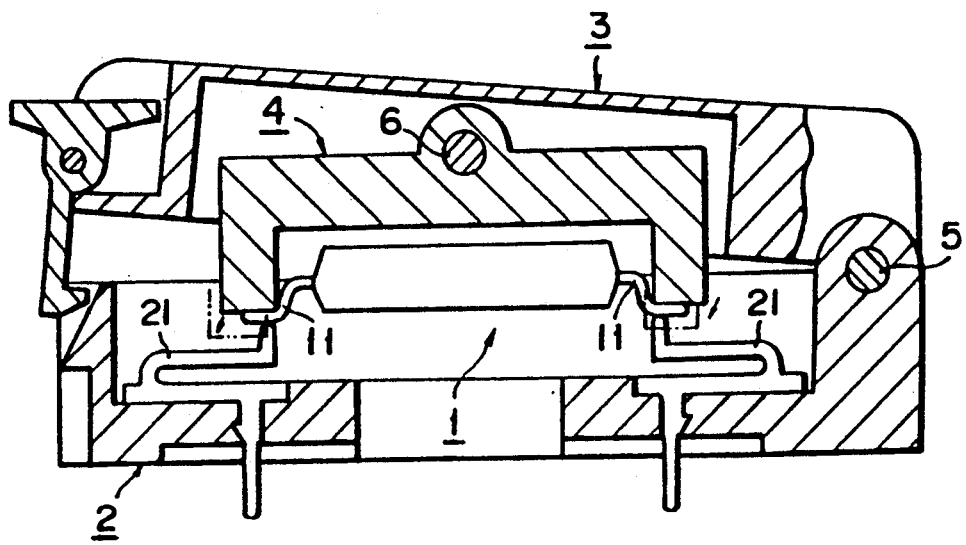
FIG. 9 is a sectional view for showing a state being closed to show the prior art.
Figure 10:
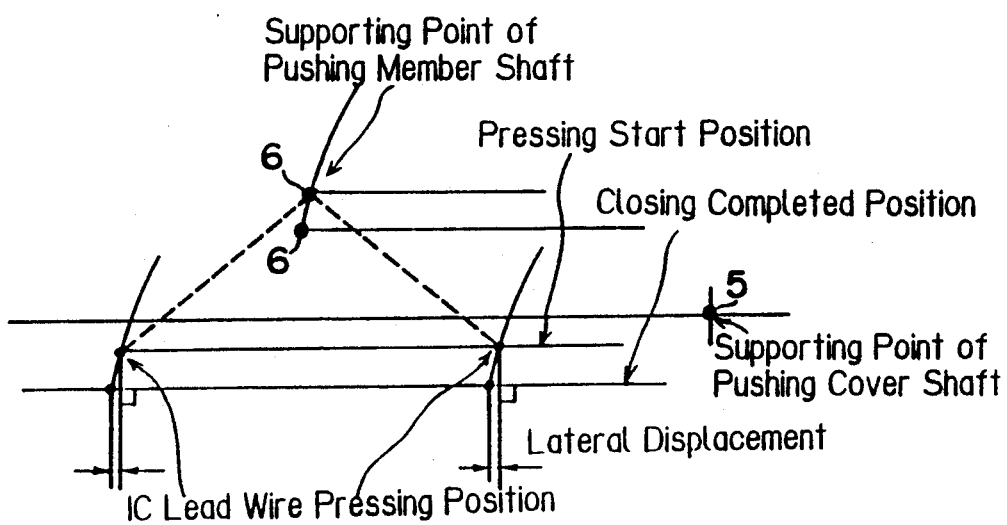
FIG. 10 is a schematic view for showing an operating locus of FIG. 9.

FIGS. 7 and 8 illustrate the third preferred embodiment of the IC socket of the present invention, and this embodiment corresponds to the device defined in claims 1 and 4.

In this preferred embodiment, a configuration of the aforesaid second preferred embodiment is basically employed. However, the differences between it and the second preferred embodiment will be described in detail.

That is, the torsion spring 81 of the pushing member 4 is removed and the pushing cover 3 and the pushing member 4 can be integrally connected by the engaging member utilizing the clamp 31 as it is. The pushing cover 3 and the pushing member 4 have heat radiation ports 33 and 44.

With such a preferred embodiment as above, similar action and effect as that of the second preferred embodiment are basically attained and an opening operation of the pushing cover 3 and the pushing member 4 is integrally performed.

In the preferred embodiment described here, is is possible to arrange the engaging member for integral formation of the pushing cover 3 and the pushing member 4 separate from the clamp 31 other than the illustrated device.

What is claimed is:

1. An IC socket comprising:
   a socket base plate having contacts to which IC lead wires of an IC to be mounted are contacted and mounted;
   a pushing cover adapted to be pushed closed against said socket base plate with an IC therebetween; and
   a pushing member for pressing the IC lead wires against said contacts in response to a closing operation of said pushing cover, said pushing cover being rotatably supported on said socket base plate, said pushing member being rotatably supported on said socket base plate separately from said pushing cover, said pushing member further comprising a supporting end for supporting said pushing member on said socket base plate, said supporting end comprising a longitudinal hole therethrough, said longitudinal hole extending vertically and forming a vertical ovate slot, to permit vertical movement of said rotatable supported pushing member on said socket base plate.

2. An IC socket according to claim 1, further comprising:
 a spring member for biasing said pushing member in a rotating opening direction and in an upward vertical direction for up and down vertical movements, said spring member arranged near said supporting end of said pushing member for said socket base plate.

3. An IC socket according to claim 1, further comprising a spring member for biasing said pushing cover in a rotating opening direction arranged near a supporting part of said pushing cover for said socket base plate, a spring member for biasing said pushing member in an upward vertical direction for up and down vertical movements, is arranged near said supporting end of said pushing member, and an engaging member for making an internal formation of a rotating opening operation of said pushing cover and a rotating opening operation of said pushing member is arranged at said pushing cover.

4. An IC socket according to claim 1, wherein guides for preventing a width-wise displacement of said pushing member are arranged on an upper surface of said socket base plate.

5. An IC socket according to claim 4, wherein said guides comprise opposing flat I-shaped pieces.

6. An IC socket according to claim 4, wherein said guides comprise concavities and projections arranged in an upper surface of said socket base plate and an inner surface of said pushing member, respectively, said projection and concavities adapted to fit with each other.

7. An IC socket according to claim 1, wherein an inner surface of said pushing cover is provided with a raised projecting abutted against the upper surface of said pushing member to push said pushing member when said pushing cover is closed.

8. An IC socket according to claim 7 wherein said projection comprises a leaf spring member.

9. An IC socket according to claim 1, further comprising a pivoting shaft for rotatable support of said pushing member by said socket base plate.

10. An IC socket according to claim 9, wherein said pivoting shaft interconnects said pushing member and said supporting end through said longitudinal hole.

11. An IC socket according to claim 1, wherein said supporting end of said pushing member supports said pushing member in translation; said IC socket further comprising a spring member for upwardly biasing said pushing member at said supporting end.

12. An IC socket according to claim 10, wherein said supporting end of said pushing member supports said pushing member in rotation and translation; said IC socket further comprising a spring member for biasing said pushing cover, in a rotating opening direction, arranged near a supporting part of said pushing cover; and a spring member, for biasing said pushing member in a rotating opening direction and an upward vertical direction for up and down vertical movements, arranged near said supporting end of said pushing member.

13. An IC socket comprising:
 a socket base plate having contacts to which IC lead wires of an IC to be mounted are contacted and mounted;
 a pushing cover adapted to be pushed closed against said socket base plate with an IC therebetween;
 a pushing member for pressing the IC lead wires against said contacts in response to a closing operation of said pushing cover, said pushing cover being rotatably supported on said socket base plate, said pushing member being rotatably supported on said socket base plate separately from said pushing cover, said pushing member further comprising a supporting end for supporting said pushing member, said supporting end comprising a longitudinal hole therethrough, said longitudinal hole extending vertically to permit vertical movement of said rotatable supported pushing member on said socket base plate; and
 a spring member for biasing said pushing cover in a rotating opening direction arranged near a supporting part of said pushing cover for said socket base plate, a spring member for biasing said pushing member in an upward vertical direction for up and down vertical movements arranged near said supporting end of said pushing member, and an engaging member for making an integral formation of a rotating opening operation of said pushing cover and a rotating opening operation of said pushing member arranged at said pushing cover.

14. An IC socket comprising:
 a socket base plate having contacts to which IC lead wires of an IC to be mounted are contacted and mounted;
 a pushing cover adapted to be pushed closed against said socket base plate with an IC therebetween;
 a pushing member for pressing the IC lead wires against said contacts in response to a closing operation of said pushing cover, said pushing cover being rotatably supported on said socket base plate, said pushing member being rotatably supported on said socket base plate separately from said pushing cover, said pushing member further comprising a supporting end for supporting said pushing member, said supporting end comprising a longitudinal hole therethrough, said longitudinal hole extending vertically to permit vertical movement of said rotatable supported pushing member on said socket base plate;
 a pivoting shaft for rotatable support of said pushing member by said socket base plate, wherein said pivoting shaft interconnects said pushing member and said supporting end through said longitudinal hole, and said pushing member comprises a supporting part for supporting said pushing member in rotation and translation, said IC socket further comprising a spring member for biasing said pushing cover, in a rotating opening direction, arranged near a supporting part of said pushing cover; and,
 a spring member, for biasing said pushing member in a rotating opening direction and an upward vertical direction for vertical up and down movements, arranged near said supporting end of said pushing member.

* * * * *

UNITED STATES PATENT AND TRADEMARK OFFICE
CERTIFICATE OF CORRECTION

PATENT NO. : 5,326,271
DATED : July 5, 1994
INVENTOR(S) : N. KISHI et al.

It is certified that error appears in the above-indentified patent and that said Letters Patent is hereby corrected as shown below:

At column 7, line 28 (claim 5, line 2), "I-shaped" to ---L-shaped---.

Signed and Sealed this

Sixth Day of May, 1997

Attest:

BRUCE LEHMAN

*Attesting Officer*     *Commissioner of Patents and Trademarks*